United States Patent [19]

Rasmussen

[11] Patent Number: 5,435,850
[45] Date of Patent: Jul. 25, 1995

[54] GAS INJECTION SYSTEM

[75] Inventor: Jorgen Rasmussen, Beaverton, Oreg.

[73] Assignee: FEI Company, Beaverton, Oreg.

[21] Appl. No.: 123,292

[22] Filed: Sep. 17, 1993

[51] Int. Cl.⁶ ............................................ C23C 16/00
[52] U.S. Cl. .................................... 118/726; 156/345;
 204/298.33; 204/298.07
[58] Field of Search .................... 118/726; 204/298.07,
 204/298.33, 298.36; 156/345, 628

[56]  References Cited

U.S. PATENT DOCUMENTS

| | | | |
|---|---|---|---|
| 4,203,554 | 5/1980 | Zimmer | 239/585 |
| 4,851,097 | 7/1989 | Hattori | 204/192.33 |
| 4,874,459 | 10/1989 | Coldren | 156/643 |
| 4,874,460 | 10/1989 | Nakagawa | 156/626 |
| 4,930,439 | 6/1990 | Sato et al. | 118/723 |
| 4,976,843 | 12/1990 | Ward | 204/298.36 |
| 5,188,705 | 2/1993 | Swanson et al. | 156/643 |
| 5,294,057 | 3/1994 | Hamilton | 239/417.3 |

Primary Examiner—R. Bruce Breneman
Assistant Examiner—Joni Y. Chang
Attorney, Agent, or Firm—Dellett and Walters

[57]  ABSTRACT

A gas injection system employs a crucible having a plurality of cylindrical bores within which gas is generated and a central passage leading to a dispensing nozzle. A chamber between the crucible bores and the central passage is sealed by a flexible membrane which is centrally clamped to a valve actuating rod that can be moved longitudinally via flexure of the membrane. A region behind the flexible membrane is sealed and vented to the system vacuum chamber whereby the enclosure within which the gas is generated is isolated.

28 Claims, 3 Drawing Sheets

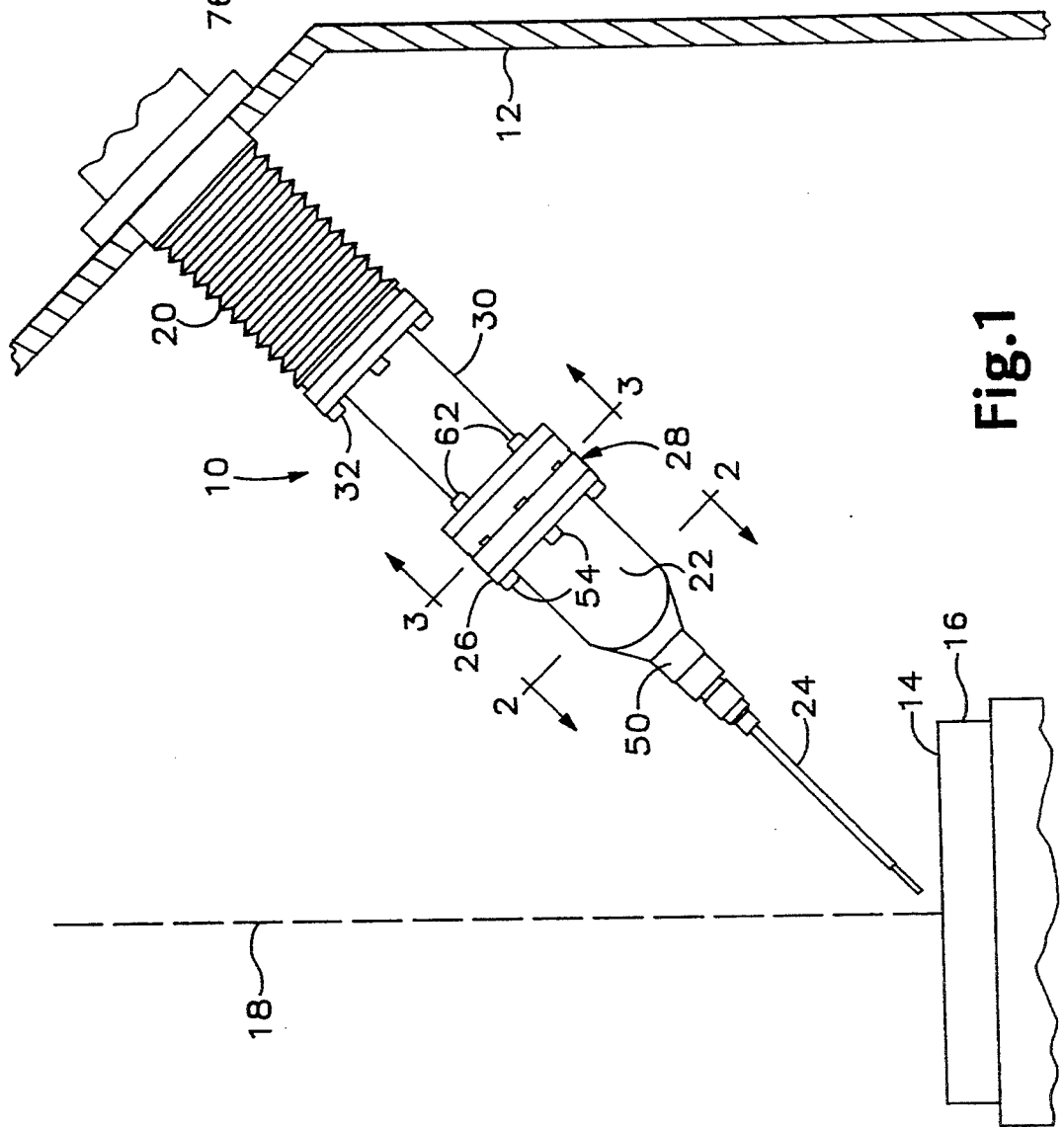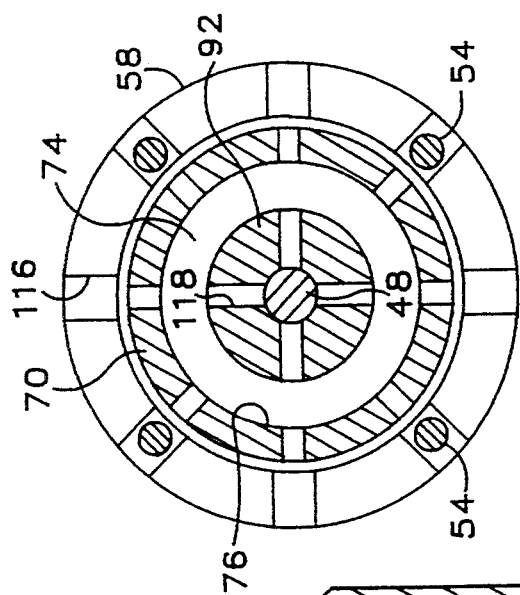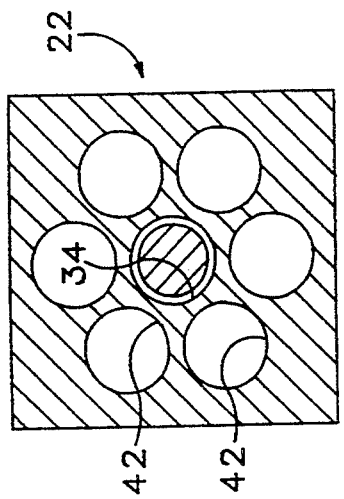

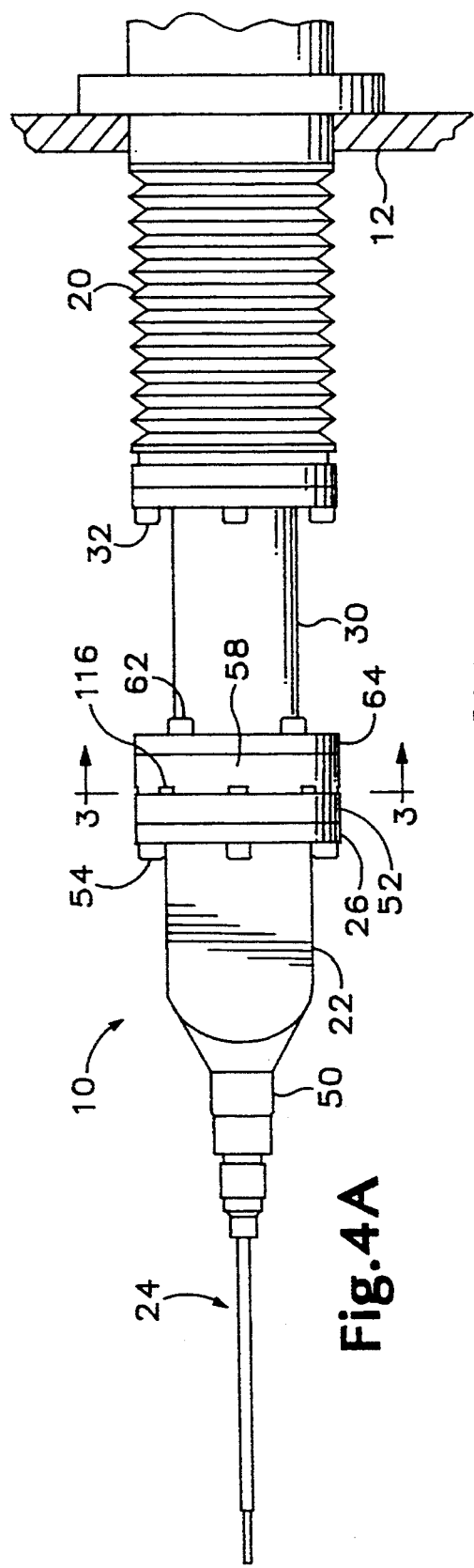
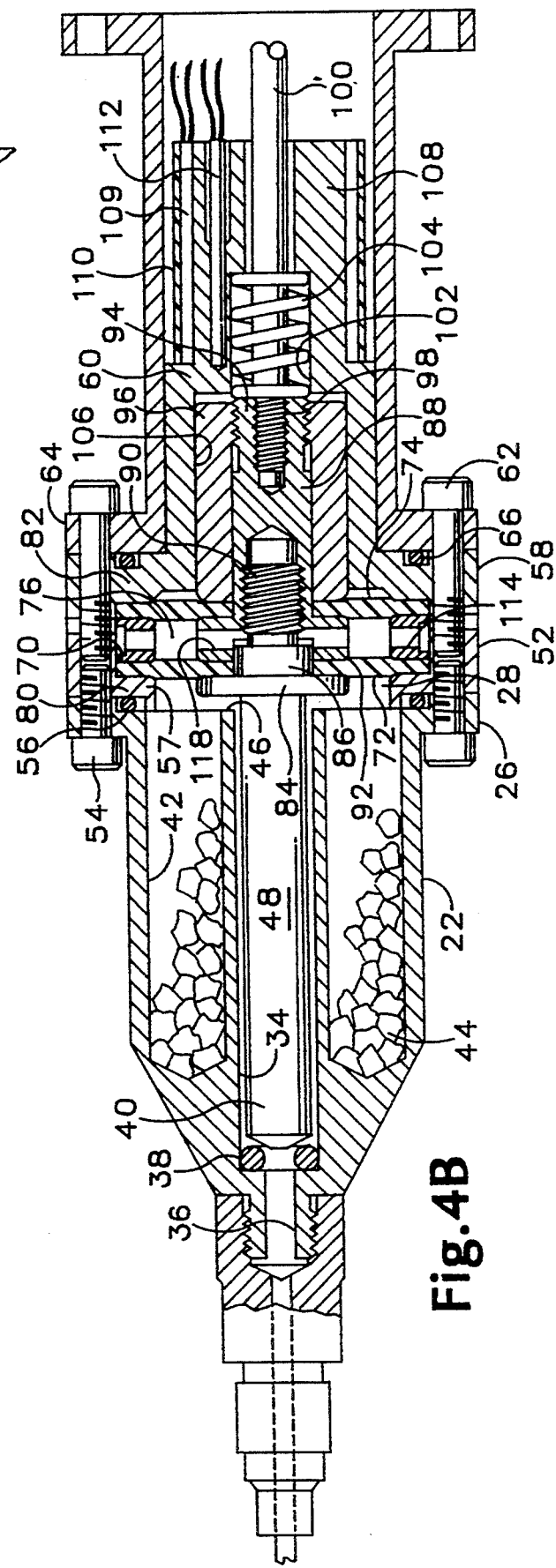
Fig.4A
Fig.4B

GAS INJECTION SYSTEM

BACKGROUND OF THE INVENTION

The present invention relates to a vapor source for focused ion beam systems and particularly to such a source which is compatible with corrosive materials.

Focused ion beam systems are used in forming, shaping or altering microscopic structures in semiconductor devices, or in other solid materials, including semiconductor or insulating surfaces and metal areas providing electrical connection. The focused ion beam can be directed to a very small point on a semiconductor device and then scanned, raster fashion, over a surface where material is to be removed. As an ion impinges on the semiconductor device surface, its momentum is transferred resulting in the removal of one or more surface atoms according to a process called sputtering. By selecting a raster pattern of a given overall shape, for example a horizontal raster pattern, a correspondingly shaped area of surface material can be removed. Often several successive layers of a semiconductive device are removed in a given area in order to reach and possibly sever an underlying layer.

It has been discovered that the above described physical sputtering process can be enhanced by the introduction of a chemically reactive gas. The gas is adsorbed on the surface of the semiconductor device prior to arrival of the ion beam and the gas reacts chemically with the surface material to produce an area of material that is more easily sputtered away. Thus, a chemical reaction takes place with the surface material resulting in easily removed compounds. Not only is gas enhanced sputtering faster, but also is less subject to redeposition of sputtered material. One focused ion beam system employing gas enhanced sputtering is described in U.S. Pat. No. 5,188,705 to Swanson et al entitled "METHOD OF SEMICONDUCTOR DEVICE MANUFACTURE". In this particular system, solid iodine is heated within a crucible for producing iodine gas that is directed toward the sample being sputtered.

Since sputtering enhancement materials are highly chemically reactive, they tend to corrode dispensing apparatus, shortening the lifetime thereof and creating potential leak problems. The typical vapor source employs a mechanically operable valve for regulating gaseous flow to the sample. However, moving surfaces tend to function improperly and stick after a relatively short lifetime. Feedthroughs for valve actuators, for instance including a sliding seal, tend to become non-functional with time. Metal bellows can be used as a mechanical feedthrough in a vacuum wall for the purpose of avoiding the sliding seal and providing protection against gas leaks. However, such bellows are not generally available in a material compatible with the aforementioned corrosive gases and moreover contain folds where corrosive substances can become trapped.

SUMMARY OF THE INVENTION

In accordance with the present invention, an injection means for directing a stream of gas toward a sample comprises a housing including a heated crucible generating a gas, a nozzle member through which the gas is dispensed, and a valve for regulating gas flow from the crucible to the nozzle member. The housing forms an enclosure for containing the gas except as dispensed from the nozzle. A portion of the housing enclosure comprises a flexible sealing member in the form of a membrane to which the valve actuator is sealingly engaged whereby the valve can be operated from outside the housing without requiring a sliding seal. Preferably the entire housing is disposed within an ion beam system vacuum chamber and the valve actuator extends through a second flexible sealing member to a region of atmospheric pressure from which the actuator is easily controlled.

In accordance with another aspect of the invention, the vapor source includes a heated crucible in the form of an elongated metal block having a central gas passage surrounded by a plurality of elongated chambers within which vaporizable material is received. The metal block conducts heat to the vaporizable material from a heat sink communicating with an external heater.

It is accordingly an object of the present invention to provide an improved gas injection system which is substantially sealed and relatively immune to harmful leaks.

It is another object of the present invention to provide an improved gas injection system characterized by efficient operation and long life.

It is a further object of the present invention to provide an improved system for dispensing corrosive gases entirely within a vacuum system.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

FIG. 1 is a side view, partially broken away, of a gas injection system according to present invention mounted within a vacuum chamber;

FIG. 2 is a cross sectional view taken at II—II in FIG. 1;

FIG. 3 is a cross sectional view taken at III—III in FIG. 1;

FIG. 4A is a side view, partially broken away, of a gas injector in accordance with a preferred embodiment of the present invention;

FIG. 4B is a longitudinal cross section, partially broken away, of the gas injector in accordance with the preferred embodiment.

DETAILED DESCRIPTION

Figure 5:
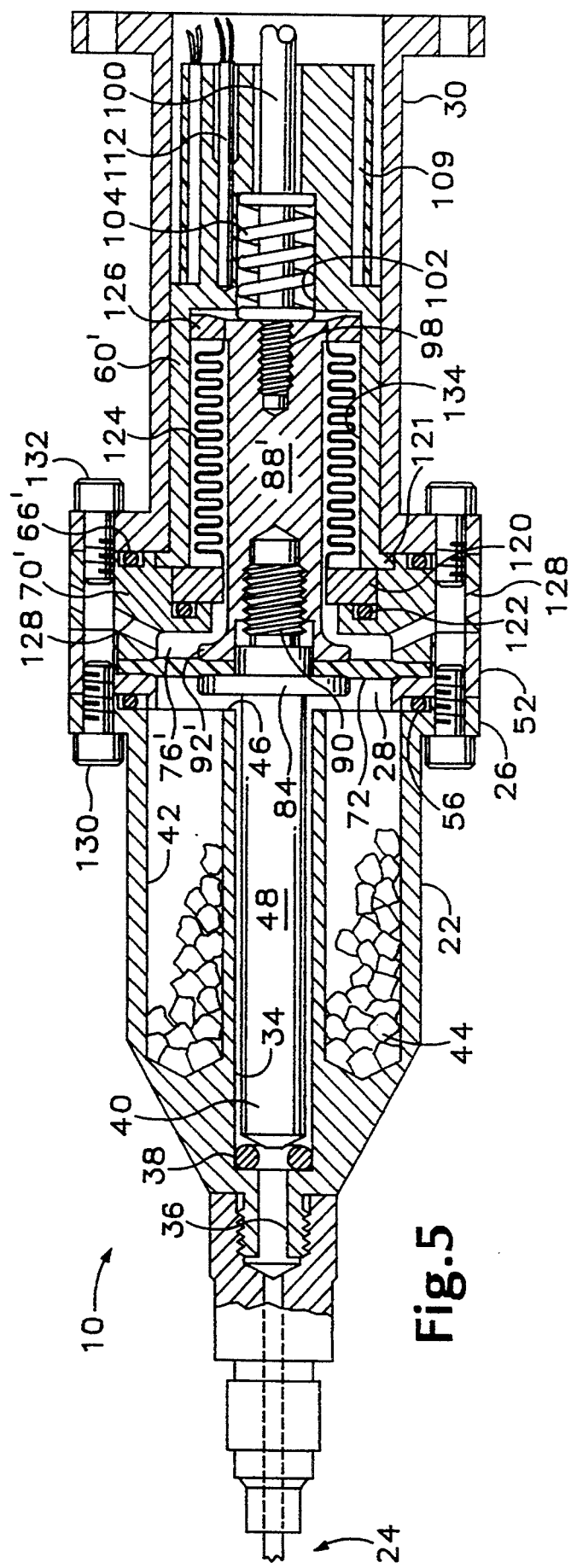
FIG. 5 is a longitudinal cross section, partially broken away, of a gas injector according to an alternative embodiment of the present invention.

Referring to FIG. 1, the gas injection means 10 in accordance with the present invention is mounted within an evacuated envelope or vacuum chamber 12 and is utilized for directing reactive gas toward a sample 14 (e.g. a semiconductor device) mounted on stage 16. An ion beam 18 generated by means not shown is deflected in a pattern over an area of sample 14 where material is to be removed. The entire injection means 10 is positioned or aimed via a mechanism located within a bellows 20 that is sealingly attached at its upper end to the wall of evacuated envelope 12.

The injection means comprises a crucible 22 within which a substance to be vaporized is received, the lower end of the crucible being provided with a nozzle member 24 in the form of a hypodermic needle having a small orifice for directing gas toward sample 14. The hypodermic needle is attached to the threaded lower end of crucible 22 by lock fitting 50. Upper flange 26 of crucible 22 is secured to the periphery of sealing chamber 28, the latter depending ultimately from support tube 30. Support tube 30 is attached with screws 32 to the lower end of bellows 20 as well as to the positioning mechanism (not shown) within the bellows.

Referring now to FIGS. 4A and 4B depicting the injection means in greater detail, crucible 22 comprises a solid metal block elongated in a direction longitudinal of hypodermic needle 24 and provided with a central cylindrical passage 34 through which gas passes to the hypodermic needle. At its lower end, the longitudinal passage 34 narrows at 36, forming a shoulder for receiving O-ring valve seal 38 that cooperates with the tapered end of valve plunger 40 for regulating the flow of gas from passage 34 to nozzle 24. Plunger 40 is located at the lower end of actuator 48, the latter comprising a rod disposed coaxially within passage 34 and extending back through the passage. The outer diameter of actuator 48 is less than the inside diameter of passage 34 in order to form a channel for the delivery of gas.

Around central passage 34 in crucible 22 there are disposed a plurality of elongated cylindrical chambers 42 parallel to and in substantially surrounding relation with cylindrical passage 34, each chamber 42 comprising a longitudinal bore in the crucible block 22 adapted to receive vaporizable material, such as iodine crystals 44. The upper end 46 of the crucible is open to a sealing chamber 28 wherein gas generated within the crucible chamber is communicated to central passage 34.

Chamber 28 is formed in part within generally cylindrical sealing member or ring 52 to which crucible flange 26 is held via a plurality of socket head screws 54. An O-ring seal 56 is provided between members 26 and 52 in a slot 57 formed between the two members. Longitudinally farther upwardly (in a direction farther away from the hypodermic needle) radial flange 58 of a stepped, cylindrical heat sink member 60 is also joined to sealing member 52 with a further plurality of socket head screws 62. Although screws 54 and 62 are shown in substantially aligned relation in FIG. 4B for purposes of drawing clarity, the screws are disposed in staggered relation about the periphery of the device as illustrated in FIG. 1 for engaging alternate threaded apertures in sealing member 52. Socket head screws 62 additionally attach radial flange 64 of support tube 30 by means of which the entire gas injector device is joined to appropriate positioning mechanism as hereinbefore indicated. An O-ring seal is located between the flanges 58 and 64.

In the cavity formed within the inside diameter of member 52 there is disposed a cylindrical spacer ring 70 adapted to separate flexible, relatively flat rubber disk shaped membranes 72 and 74, wherein membrane 72 defines the upper wall of sealing chamber 28 and membrane 74 is positioned for defining a region 76 between the two membranes which is vented to the vacuum chamber as hereinafter discussed. The periphery or margin of membrane 72 is clamped in sealing relation between a side of spacer ring 70 and interior shoulder 80 of sealing member 52, while the periphery or margin of membrane 74 is disposed between the opposite side of spacer ring 70 and land 82 at the lower end of heat sink 60. Screws 62 are drawn up tightly to sealingly clamp the peripheral edges of the membranes 72 and 74 in place.

Actuator 48 includes a radial flange 84 within chamber 28 for centrally engaging membrane 72, while portion 86 of the actuator passes through a central aperture in membrane 72 and into a recess at the lower end of a center membrane spacer 88. Actuator 48 has a threaded portion 90 adapted to engage a mating thread in center membrane spacer 88.

Center membrane spacer 88 is provided at its lower end with a disk shaped head 92 having spaced sides for tightly engaging the central portions of membranes 72 and 74. As threaded portion 90 is drawn up, membrane 72 is sealingly engaged between head 92 and flange 84, with the actuator passing through the membrane.

Furthermore, the center membrane spacer 88 is provided with an upper threaded portion 94 mating with internal threads of actuator support tube 96 disposed in surrounding relation to spacer 88 for tightly engaging membrane 74 at the lower end of support tube 96 as the support tube is drawn up tightly on threaded portion 94. Tube 96 is slideable within recess 106 in heat sink 60 and is attached via internal threads 98 to the lower end of actuating rod 100. Rod 100 is adapted to receive linear motion under the control of means within the positioning mechanism inside bellows 20 in FIG. 1 or therebeyond. Upper cavity 102 in heat sink 60 houses a spring 104 acting between the heat sink and the upper end of center membrane spacer 88 so that the membrane spacer and attached parts including support tube 96 and actuator 48 are normally biased in a direction for closing plunger 40 against O-ring 38 to close off the flow of gas. However, when rod 100 is pulled upwardly (by means not shown) the valve is opened as support tube 96 slides within lower recess 106 in heat sink 60. The membranes 72 and 74 flex with movement of the actuator.

Upper end portion 108 of heat sink 60 is of reduced cylindrical diameter and receives therearound a band heater 109 provided electrical current by means not shown, the heater being covered and held in place by shrink band 110. A thermistor 112 is embedded within portion 108 of the heat sink, and when electrical current is supplied to band heater 109, the thermistor 112 provides feedback to a control circuit for regulating the temperature of the heat sink at a desired elevated level for heating the crucible 22 and the material therewithin. The heater and control therefor are conveniently located outside the vacuum region of chamber 12 eliminating electrical feedthroughs, but the heat generated is conducted via the vacuum wall (through the heat sink and sealing member 52) to the crucible. The solid construction of the crucible 22 provided with bores for receiving crystals 44 provides excellent heat transfer and also maintains the temperature in passage 34 to nozzle 24. Moreover, the location of the crystals 44 in chambers 42 at the nozzle end of the device provides a short path for the generated gas and avoids unwanted condensation within or close to the end of the device.

It will be seen the gas injection system according to the present invention forms a housing providing an enclosure for generating and containing gas therewithin. In particular, this enclosure includes chambers 42 and central passage 34 of crucible 22 as well as sealing chamber 28 surrounded by the lower end of sealing member 80. The gas tight enclosure additionally comprises the flexible rubber membrane 72 clamped between sealing member 80 and spacer ring 70 at the periphery thereof, while also being centrally clamped in sealing relation to actuator 48 between actuator flange 84 and the head 92 of spacer 88.

Spacer ring 70 includes a plurality of radial passages 114 which extend outwardly from region 76 between membranes 72 and 74 and provide venting into the vacuum chamber via further radial passages 116 formed by the lower castellated shape of heat sink 60. (See FIG. 3.) Moreover, head 92 of center spacer member 88 also includes radial passages 118 that communicate with interior bores of the central spacer member 88. Thus the region between membranes 72 and 74 is vented directly to the vacuum chamber and is normally evacuated during operation of the apparatus.

Membrane 74 separates the region 76 from atmospheric pressure present within support tube 30. A double barrier is provided between the region where corrosive gas is generated and the external atmosphere outside the vacuum chamber, the corrosive gas generation being totally enclosed within the vacuum chamber, i.e., surrounded on all sides by the vacuum chamber, such that any malfunction of or leak with respect to membrane 72 will leak gas only into the vacuum chamber and will be evacuated therefrom. Moreover, if membrane 74 were to become punctured, while membrane 72 remained intact, the vacuum chamber would receive air through the puncture without outgassing volatilizable material to the atmosphere. The venting of region 76 behind membrane 72 to the vacuum chamber relieves pressure on membrane 72 and enhances easy flexure thereof, while passages 114 avoid any "virtual leak" from region 76 into the vacuum chamber.

It is thus noted the gas generation apparatus is totally isolated within the vacuum chamber, without requiring a sliding seal or the like to allow the valve actuator to be operated externally. A superior seal is formed while the corrosive effect of the gas on a sliding actuator seal is avoided.

In the preferred embodiment of the present invention, the metal parts are for the most part formed of molybdenum including crucible 22, sealing member 52, ring 114, central spacing member 88, tube 96 and lock fitting 50. However, another corrosive resistant material such as titanium can be used. Heat sink 60 is preferably copper. The disk shaped, flexible membranes 72 and 74 in the particular embodiment were formed of fluorocarbon elastomer marketed under the name Viton (formulation V-884-75) by Parker Seal Group of Lexington, Ky., this material being resistant to corrosive attack. These membranes were 0.075 inches thick and each had a diameter of one inch.

In operation, the device according to the present invention is employed for supplying a stream of gas directed at a sample being irradiated by an ion beam. Before such operation is commenced, the lower vacuum chamber is opened and crucible 22 is removed from sealing member 52 by removing socket head screws 54. The substance from which gas is to be generated, e.g. the iodine crystals 44, is placed within chambers 42 of crucible 22, and the crucible is reattached to the rest of the structure so as to assume an attitude generally depicted in FIG. 1. The sample 14 is placed on stage 16 and the chamber 12 may be closed and evacuated before the positioning mechanism is employed for directing nozzle 24 toward the location where ion beam 18 is to impinge the sample. The crucible is heated in response to supply of current to heater 108, and the temperature is regulated so that gas is generated, while actuator rod 100 is withdrawn from outside the apparatus to open and regulate the position of valve plunger 40.

An alternative embodiment according to the present invention is depicted in FIG. 5 wherein corresponding parts are designated by like reference numerals. This embodiment differs primarily in that only one flexible rubber membrane 72 is utilized between sealing chamber 28 and region 76' beyond membrane 72. A metal bellows 124 separates region 76' above membrane 72 from atmospheric pressure within support tube 30. The bellows 124 extends between rings 120 and 126, the former being locked between spacer ring member 70' and heat sink 60', while the latter is secured to the upper end of center rod extension 8' proximate the end of cavity 134 of sink 60' within which it slides as rod 100 is moved against the bias of spring 104 to open and close the valve comprising plunger 40 and O-ring 38.

Ring 120 is held between lower flange 121 of heat sink 60' and the inward part of ring member 70', with O-ring seal 122 disposed therebetween in a slot in member 70'. Radial flange 121 is held between member 70' and the end flange of support tube 30. Member 70' sealingly clamps membrane 72 against sealing ring 52 as screws 132 are drawn up. Center rod extension 88' is threadably engaged at 90 by the end of actuator 48 whereby the center of membrane 72 is sealingly disposed between flange 84 and head 92' of center rod extension 88'.

Ring member 70' is supplied with outwardly extending passages 128 which vent region 70' beyond membrane 72 to the vacuum within vacuum chamber 12 so that the gas generating region is totally enclosed within the vacuum environment. It will be noted that evacuated region 76' is located partly within the bellows 124.

In this embodiment, the ring member 70' extends to the periphery of the device and screws 132 which secure ring 52 to the device support tube 30 pass through member 70'. Although screws 132 are shown short in FIG. 5 to reveal vent passages 128, it should be noted that every other screw 132 about the periphery of the device extends to threadably engage sealing ring member 52 for urging member 70' in sealing relation against the periphery of membrane 72. It will be appreciated that the embodiment of the gas injection system as depicted in FIG. 5 operates in substantially the same manner as hereinbefore described with reference to FIGS. 4A and 4B. The bellows 124 is usable in the FIG. 5 embodiment inasmuch as it does not come into direct contact with corrosive vapor.

While plural embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A gas injection system for mounting in a vacuum chamber adapted to receive a sample for subjection to particle beam irradiation, said system comprising:

injection means for directing a stream of gas toward said sample, said injection means comprising a gas source housing for providing said gas, and valve means for controlling the flow of said gas;

said housing forming an enclosure for containing said gas therewithin except for gas dispensed toward said sample;

wherein a portion of the housing enclosure comprises a flexible sealing member in the form of a membrane; and an actuator operatively coupled through said membrane for operating said valve means by external actuation thereof with accommodating flexure of said membrane.

2. The system according to claim 1 wherein said membrane separates said housing from said vacuum chamber.

3. The system according to claim 2 wherein said actuator extends centrally through and is secured in sealing relation to said membrane, and the margin of said membrane is sealingly engaged by said housing.

4. The system according to claim 3 further including a second sealing member for separating said vacuum chamber from atmospheric pressure, said actuator extending through said second sealing member in sealed relation thereto so that said actuator is operable externally of said vacuum chamber.

5. The system according to claim 4 wherein said second sealing member comprises a second membrane.

6. The system according to claim 4 wherein said second sealing member comprises a bellows.

7. The system according to claim 4 including means providing communication from the region between the first mentioned and second sealing members to the vacuum chamber for maintaining a vacuum between said sealing members.

8. The system according to claim 1 wherein said gas source includes crucible means comprising a heated block provided with a plurality of elongated chambers surrounding a central passage in operative relation with said valve means and through which gas is dispensed.

9. A gas injection system for mounting in a vacuum chamber adapted to receive a sample for particle beam irradiation, said system comprising:

injection means for directing a stream of gas toward said sample, said injection means comprising a nozzle member having a small orifice directable toward a surface of said sample, a crucible for receiving material to be vaporized, including a gas passage for communicating between said crucible and said nozzle member, valve means for selectively closing said gas passage, and means for heating said crucible;

said valve means being provided with actuating means having control means operable from outside said gas passage and crucible; and means isolating said control means from said gas passage and crucible including a flexible, relatively flat membrane through which said actuating means extends;

said membrane providing a seal with said actuating means.

10. The system according to claim 9 further including a sealing member for isolating said vacuum chamber from the external atmosphere, said actuating means extending through said sealing member.

11. The system according to claim 10 wherein said sealing member comprises a second flexible membrane.

12. The system according to claim 10 wherein said sealing member comprises a bellows.

13. The system according to claim 10 including means providing communication from the region between said membrane and said sealing member to the vacuum chamber for maintaining a vacuum between said membrane and said sealing member.

14. The system according to claim 9 wherein said crucible comprises a heated block centrally enclosing said gas passage and provided with a plurality of elongated chambers for receiving said material to be vaporized.

15. The system according to claim 14 wherein said heating means is external to said crucible and vacuum chamber, and further including heat sink means for conducting heat from said heating means to said crucible.

16. A gas injection system for mounting in a vacuum chamber adapted to receive a sample for particle beam irradiation, said system comprising:

an elongated crucible for receiving material to be vaporized, said crucible having plural cavities extending upwardly to a first end of said crucible;

a nozzle member joined to a second end of said crucible, said nozzle member having a small orifice directable toward a surface of said sample, said elongated crucible having a central passage extending through said crucible for communicating gas to said nozzle member, wherein said central passage is provided with valve means;

means defining a chamber at said first end of said crucible for communicating from said plural cavities of said crucible to said central passage;

said chamber-defining means including a flexible membrane disposed across said crucible in spaced relation to upper ends of said cavities and said central passage;

a movable actuator for said valve means, said actuator extending longitudinally of said central passage and through said membrane in sealing relation thereto, said membrane preserving said seal while flexing with movement of said actuator; and means clamping the periphery of said membrane in sealing relation with respect to said first end of said crucible.

17. The system according to claim 16 including clamping means movable with said actuator for providing clamping in providing the sealing relation of said membrane to said actuator.

18. The system according to claim 16 wherein said membrane is formed of rubber.

19. The system according to claim 16 wherein said valve means comprises an O-ring seal proximate said central passage cooperating with a plunger at the lower end of said actuator.

20. The system according to claim 16 further including a flexible sealing member in spaced relation to the side of said membrane remote from said nozzle member and through which said actuator extends in sealing relation, and means defining a passage from the region between said sealing member and said membrane to the interior of said vacuum chamber.

21. The system according to claim 20 wherein said sealing member comprises a second membrane.

22. The system according to claim 21 wherein said second membrane is formed of rubber.

23. The system according to claim 21 wherein said means defining a passage comprises an annular spacer disc between said membranes provided with radial passages.

24. The system according to claim 20 wherein said sealing member comprises a bellows.

25. A gas injection system for mounting in a vacuum chamber adapted to receive a sample for particle beam irradiation, said system comprising:

injection means for directing a stream of gas toward said sample, said injection means comprising a gas source housing including a heated crucible for generating said gas, a nozzle member through which said gas is dispensed, and valve means for controlling the flow of gas from said crucible to said nozzle member;

wherein said crucible comprises a unitary block of metal provided with a longitudinal central passage leading to said nozzle member, and a plurality of elongated chambers in said block for receiving material to be vaporized to provide said gas, said elongated chambers comprising longitudinal bores in said block in substantially surrounding relation to said central passage.

26. The system according to claim 25 further provided with a metal heat sink means for conducting heat to said block.

27. The system according to claim 26 including heating means external to said vacuum chamber, wherein heat is conducted from said heating means to said crucible via said metal heat sink means.

28. The system according to claim 25 wherein said valve means includes an elongate actuator coaxially aligned within said central passage of the unitary block and an O-ring seal at an end of said central passage proximate said nozzle member for engaging said actuator during actuation thereof to control the flow of gas to said nozzle member.

* * * * *